United States Patent
Yang et al.

(10) Patent No.: US 10,212,374 B2
(45) Date of Patent: Feb. 19, 2019

(54) PIXEL CIRCUIT, DRIVING METHOD THEREOF, IMAGE SENSOR, AND IMAGE ACQUISITION APPARATUS

(71) Applicants: Boe Technology Group Co., Ltd., Beijing (CN); Beijing Boe Optoelectronics Technology Co., Ltd., Beijing (CN)

(72) Inventors: Shengji Yang, Beijing (CN); Xue Dong, Beijing (CN); Hailin Xue, Beijing (CN); Xiaochuan Chen, Beijing (CN); Yingming Liu, Beijing (CN); Haisheng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/572,717

(22) PCT Filed: May 26, 2017

(86) PCT No.: PCT/CN2017/086141
§ 371 (c)(1),
(2) Date: Nov. 8, 2017

(87) PCT Pub. No.: WO2018/001014
PCT Pub. Date: Jan. 4, 2018

(65) Prior Publication Data
US 2018/0234655 A1   Aug. 16, 2018

(30) Foreign Application Priority Data
Jun. 29, 2016 (CN) .......................... 2016 1 0505408

(51) Int. Cl.
*H04N 5/374* (2011.01)
*H04N 5/3745* (2011.01)
(Continued)

(52) U.S. Cl.
CPC ......... *H04N 5/3745* (2013.01); *H01L 27/142* (2013.01); *H01L 27/14643* (2013.01)

(58) Field of Classification Search
CPC .................................................... H04N 5/3745
(Continued)

(56) References Cited

U.S. PATENT DOCUMENTS 9,432,602 B2 * 8/2016 Takatsuka ............ H04N 5/3698
2006/0249659 A1   11/2006 Takano et al.
(Continued)

FOREIGN PATENT DOCUMENTS

CN   102196201 A   9/2011
CN   102202190 A   9/2011
(Continued)

OTHER PUBLICATIONS

Written Opinion received for PCT Patent Application No. PCT/CN2017/086141, dated Aug. 31, 2017, 16 pages (3 pages of English Translation and 13 pages of original document).
(Continued)

*Primary Examiner* — Joel W Fosselman
(74) *Attorney, Agent, or Firm* — Womble Bond Dickinson (US) LLP

(57) ABSTRACT

A pixel circuit includes: an initialization circuit that initializes a storage circuit; a photoelectric conversion circuit that converts incident light into an electrical signal; a photoelectric conversion control circuit that controls the photoelectric conversion circuit to convert the incident light into the electrical signal; an output signal generation circuit that generates an output signal of the pixel circuit corresponding
(Continued)

to the incident light in dependence on the electrical signal converted by the photoelectric conversion circuit; a compensation circuit that acquires a threshold voltage of the output signal generation circuit; a storage circuit that stores the electrical signal converted by the photoelectric conversion circuit and the threshold voltage of the output signal generation circuit; and an output control circuit that controls the output of the output signal of the pixel circuit corresponding to the incident light.

19 Claims, 8 Drawing Sheets

(51) Int. Cl.
  *H01L 27/142*  (2014.01)
  *H01L 27/146*  (2006.01)

(58) Field of Classification Search
  USPC .................................................. 348/308
  See application file for complete search history.

(56) References Cited

U.S. PATENT DOCUMENTS

| | | | | |
|---|---|---|---|---|
| 2009/0009619 | A1* | 1/2009 | Takeda | H04N 5/357 |
| | | | | 348/222.1 |
| 2009/0309863 | A1 | 12/2009 | Seto | |
| 2012/0026370 | A1 | 2/2012 | Oike et al. | |
| 2013/0083204 | A1 | 4/2013 | Solhusvik et al. | |
| 2014/0049675 | A1 | 2/2014 | Takatsuka et al. | |
| 2017/0126994 | A1 | 5/2017 | Duan et al. | |
| 2017/0256202 | A1 | 9/2017 | Sun | |

FOREIGN PATENT DOCUMENTS

| | | |
|---|---|---|
| CN | 102930824 A | 2/2013 |
| CN | 103595930 A | 2/2014 |
| CN | 104835453 A | 8/2015 |
| CN | 104867431 A | 8/2015 |
| CN | 105208302 A | 12/2015 |
| CN | 105933623 A | 9/2016 |
| JP | 2006-279324 A | 10/2006 |

OTHER PUBLICATIONS

Office Action received for Chinese Patent Application No. 201610505408.3, dated Jun. 19, 2018, 15 pages (8 pages of English Translation and 7 pages of Original office action).

International Search Report received for PCT Application No. PCT/CN2017/086141, dated Aug. 31, 2017, 6 pages (2 pages of English Translation and 4 pages of original document).

* cited by examiner

PIXEL CIRCUIT, DRIVING METHOD THEREOF, IMAGE SENSOR, AND IMAGE ACQUISITION APPARATUS

CROSS REFERENCE TO RELATED APPLICATIONS

This application is the U.S. national phase entry of PCT/CN2017/086141, with an international filing date of May 25, 2017, which claims the benefit of priority from Chinese Patent Application No. 201610505408.3 filed on Jun. 29, 2016, which is hereby incorporated by reference in its entirety as part of this application.

TECHNICAL FIELD

Embodiments of the present disclosure relate to the field of image sensing technology, and particularly to a pixel circuit and its driving method, an image sensor, and an image acquisition apparatus.

BACKGROUND

In the field of image sensing technology, complementary metal oxide semiconductor (CMOS) technology is widely used. A CMOS is a circuit composed of PMOS and NMOS transistors which are complementary, and hence is called a complementary MOS, i.e., CMOS. Taking a NOT gate as an example which consists of a pair of a PMOS transistor and an NMOS transistor, the instantaneous states of the PMOS and NMOS transistors include: only the PMOS is in conduction; only the NMOS is conduction; or both of them are off. The CMOS has higher efficiency and lower power consumption than a triode circuit.

In a CMOS image sensor, the CMOS device is used to generate and output an output signal corresponding to the incident light based on an electrical signal generated by the photoelectric conversion device. The threshold voltage of the transistor used to generate the output signal may suffer a voltage drift due to the fabrication process or the like, and therefore, different output signals may be generated for the same incident light by different CMOS devices or the same CMOS devices at different times, resulting in distortion of the image obtained by the CMOS image sensor.

SUMMARY

Embodiments of the present disclosure provide a pixel circuit and its driving method, an image sensor, and an image acquisition apparatus.

According to a first aspect of the embodiments of the present disclosure, a pixel circuit is provided comprising: an initialization circuit configured to initialize a voltage stored by a storage circuit; a photoelectric conversion circuit configured to convert incident light into an electrical signal; a photoelectric conversion control circuit connected to the photoelectric conversion circuit and configured to control the photoelectric conversion circuit to convert the incident light into the electrical signal and store the electrical signal in the storage circuit; an output signal generation circuit connected to the photoelectric conversion control circuit and configured to generate an output signal of the pixel circuit corresponding to the incident light in dependence on the electrical signal converted by the photoelectric conversion circuit; a compensation circuit connected to the output signal generation circuit and configured to acquire and store a threshold voltage of the output signal generation circuit in the storage circuit; a storage circuit connected to the photoelectric conversion control circuit and the output signal generation circuit and configured to store the electrical signal converted by the photoelectric conversion circuit and the threshold voltage of the output signal generation circuit; and an output control circuit connected to the output signal generation circuit and configured to control output of the output signal of the pixel circuit corresponding to the incident light.

In certain embodiments of the present disclosure, the output signal generation circuit comprises a control terminal, a first terminal and a second terminal. The compensation circuit comprises a control terminal, a first terminal and a second terminal. The control terminal of the compensation circuit is connected with a second scan signal terminal, the first terminal of the compensation circuit is connected with the control terminal of the output signal generation circuit, and the second terminal of the compensation circuit is connected with the second terminal of the output signal generation circuit.

In certain embodiments of the present disclosure, the output signal generation circuit comprises a third transistor. A control terminal of the third transistor is the control terminal of the output signal generation circuit, a first terminal of the third transistor is the first terminal of the output signal generation circuit, and a second terminal of the third transistor is the second terminal of the output signal generation circuit.

In certain embodiments of the present disclosure, the compensating circuit comprises a second transistor. A control terminal of the second transistor is the control terminal of the compensation circuit, a first terminal of the second transistor is the first terminal of the compensation circuit, and a second terminal of the second transistor is the second terminal of the compensation circuit.

In certain embodiments of the present disclosure, the storage circuit comprises: a first storage circuit configured to store the threshold voltage of the output signal generation circuit; and a second storage circuit configured to store the electrical signal converted by the photoelectric conversion circuit. The initialization circuit comprises: a first initialization circuit configured to initialize the first storage circuit; and a second initialization circuit configured to initialize the second storage circuit.

In certain embodiments of the present disclosure, the first initialization circuit comprises a control terminal, a first terminal and a second terminal. The second initialization circuit comprises a control terminal, a first terminal and a second terminal. The photoelectric conversion circuit comprises a first terminal and a second terminal. The photoelectric conversion control circuit comprises a control terminal, a first terminal and a second terminal. The first storage circuit comprises a first terminal and a second terminal. The second storage circuit comprises a first terminal and a second terminal. The output control circuit comprises a control terminal, a first terminal and a second terminal. The control terminal of the first initialization circuit is connected with a first scan signal terminal, the first terminal of the first initialization circuit is connected with a first voltage terminal, and the second terminal of the first initialization circuit is connected with the second terminal of the first storage circuit. The control terminal of the second initialization circuit is connected with a third scan signal terminal, the first terminal of the second initialization circuit is connected with a second voltage terminal, and the second terminal of the second initialization circuit is connected with the second terminal of the second storage circuit. The first terminal of the photoelectric conversion circuit is connected with a third voltage terminal, and the second terminal of the photoelectric conversion circuit is connected with the first terminal of the photoelectric conversion control circuit. The control terminal of the photoelectric conversion control circuit is connected with the first scan signal terminal, and the second terminal of the photoelectric conversion control circuit is connected with the second terminal of the second storage circuit. The control terminal of the output signal generation circuit is connected with the second terminal of the first storage circuit, the first terminal of the output signal generation circuit is connected with the second terminal of the second storage circuit, and the second terminal of the output signal generation circuit is connected with the first terminal of the output control circuit. The first terminal of the first storage circuit is connected with the second voltage terminal. The first terminal of the second storage circuit is connected with the third voltage terminal. The control terminal of the output control circuit is connected with a fourth scan signal terminal, and the second terminal of the output control circuit is connected with a signal output terminal.

In certain embodiments of the present disclosure, the first initialization circuit comprises a first transistor. A control terminal of the first transistor is the control terminal of the first initialization circuit, a first terminal of the first transistor is the first terminal of the first initialization circuit, and a second terminal of the first transistor is the second terminal of the first initialization circuit.

In certain embodiments of the present disclosure, the second initialization circuit comprises a fourth transistor. A control terminal of the fourth transistor is the control terminal of the second initialization circuit, a first terminal of the fourth transistor is the first terminal of the second initialization circuit, and a second terminal of the fourth transistor is the second terminal of the second initialization circuit.

In certain embodiments of the present disclosure, the photoelectric conversion circuit comprises a photoelectric conversion device. A first terminal of the photoelectric conversion device is the first terminal of the photoelectric conversion circuit, and a second terminal of the photoelectric conversion device is the second terminal of the photoelectric conversion circuit.

In certain embodiments of the present disclosure, the photoelectric conversion device is a photodiode.

In certain embodiments of the present disclosure, the photoelectric conversion control circuit comprises a fifth transistor. A control terminal of the fifth transistor is the control terminal of the photoelectric conversion control circuit, a first terminal of the fifth transistor is the first terminal of the photoelectric conversion control circuit, and a second terminal of the fifth transistor is the second terminal of the photoelectric conversion control circuit.

In certain embodiments of the present disclosure, the first storage circuit comprises a first capacitor. A first terminal of the first capacitor is the first terminal of the first storage circuit, and a second terminal of the first capacitor is the first terminal of the first storage circuit.

In certain embodiments of the present disclosure, the second storage circuit comprises a second capacitor. A first terminal of the second capacitor is the first terminal of the second storage circuit, and a second terminal of the second capacitor is the second terminal of the second storage circuit.

In certain embodiments of the present disclosure, the output control circuit comprises a sixth transistor. A control terminal of the sixth transistor is the control terminal of the output control circuit, a first terminal of the sixth transistor is the first terminal of the output control circuit, and a second terminal of the sixth transistor is the second terminal of the output control circuit.

According to a second aspect of the embodiments of the present disclosure, a pixel circuit driving method is provided for driving the pixel circuit as described above, which comprises: in an initialization phase, initializing by the initialization circuit a voltage stored in the storage circuit; in a photoelectric conversion phase, converting incident light into an electrical signal and storing the electrical signal in the storage circuit, by the photoelectric conversion circuit under control of the photoelectric conversion control circuit; in a compensation phase, acquiring and storing by the compensation circuit a threshold voltage of the output signal generation circuit in the storage circuit; and in an output phase, generating an output signal of the pixel circuit corresponding to the incident light based on the electrical signal stored in the storage circuit by the output signal generation circuit under control of the output control circuit, and outputting the output signal by the pixel circuit.

In certain embodiments of the present disclosure, the storage circuit comprises a first storage circuit configured to store the threshold voltage of the output signal generation circuit, and a second storage circuit configured to store the electrical signal converted by the photoelectric conversion circuit. The initialization circuit comprises a first initialization circuit configured to initialize the first storage circuit, and a second initialization circuit configured to initialize the second storage circuit. The first initialization circuit comprises a control terminal, a first terminal and a second terminal. The second initialization circuit comprises a control terminal, a first terminal and a second terminal. The photoelectric conversion circuit comprises a first terminal and a second terminal. The photoelectric conversion control circuit comprises a control terminal, a first terminal and a second terminal. The output signal generation circuit comprises a control terminal, a first terminal and a second terminal. The compensation circuit comprises a control terminal, a first terminal and a second terminal. The first storage circuit comprises a first terminal and a second terminal. The second storage circuit comprises a first terminal and a second terminal. The output control circuit comprises a control terminal, a first terminal and a second terminal. The control terminal of the first initialization circuit is connected with a first scan signal terminal, the first terminal of the first initialization circuit is connected with a first voltage terminal, and the second terminal of the first initialization circuit is connected with the second terminal of the first storage circuit. The control terminal of the second initialization circuit is connected with a third scan signal terminal, the first terminal of the second initialization circuit is connected with a second voltage terminal, and the second terminal of the second initialization circuit is connected with the second terminal of the second storage circuit. The first terminal of the photoelectric conversion circuit is connected with a third voltage terminal, and the second terminal of the photoelectric conversion circuit is connected with the first terminal of the photoelectric conversion control circuit. The control terminal of the photoelectric conversion control circuit is connected with the first scan signal terminal, and the second terminal of the photoelectric conversion control circuit is connected with the second terminal of the second storage circuit. The control terminal of the output signal generation circuit is connected with the second terminal of the first storage circuit, the first terminal of the output signal generation circuit is connected with the second terminal of the second storage circuit, and the second terminal of the output signal generation circuit is connected with the first terminal of the output control circuit. The control terminal of the compensation circuit is connected with a second scan signal terminal, the first terminal of the compensation circuit is connected with the control terminal of the output signal generation circuit, and the second terminal of the compensation circuit is connected with the second terminal of the output signal generation circuit. The first terminal of the first storage circuit is connected with the second voltage terminal. The first terminal of the second storage circuit is connected with the third voltage terminal. The control terminal of the output control circuit is connected with a fourth scan signal terminal, and the second terminal of the output control circuit is connected with a signal output terminal. The voltage at the first voltage terminal is at a low level, the voltage at the second voltage terminal is at a high level, and the voltage at the third voltage terminal is at a low level. In the initialization phase, the voltage at the first scan signal terminal is at an active level, the voltage at the second scan signal terminal is at an inactive level, the voltage at the third scan signal terminal is at an active level, and the voltage at the fourth scan signal terminal is at an inactive level. In the photoelectric conversion phase, the voltage at the first scan signal terminal is at an active level, the voltage at the second scan signal terminal is at an inactive level, the voltage at the third scan signal terminal is at an inactive level, and the voltage at the fourth scan signal terminal is at an inactive level. In the compensation phase, the voltage at the first scan signal terminal is at an inactive level, the voltage at the second scan signal terminal is at an active level, the voltage at the third scan signal terminal is at an inactive level, and the voltage at the fourth scan signal terminal is at an inactive level. In the output phase, the voltage at the first scan signal terminal is at an inactive level, the voltage at the second scan signal terminal is at an inactive level, the voltage at the third scan signal terminal is at an active level, and the voltage at the fourth scan signal terminal is at an active level.

In certain embodiments of the present disclosure, in the photoelectric conversion phase, the voltage at the second terminal of the second storage circuit is Vdata, Vdata being the electrical signal converted by the photoelectric conversion circuit. In the compensation phase, the voltage at the second terminal of the first storage circuit is Vdata−Vth, Vth being the threshold voltage at which the output signal generation circuit generates the output signal. In the output phase, the output signal generated by the output signal generation circuit is $I=K[Vvdd-(Vdata-Vth)-Vth]^2=K(Vvdd-Vdata)^2$, K being a constant dependent on a structure of the output signal generation circuit, Vvdd being the voltage at the second voltage terminal.

According to a third aspect of the embodiments of the present disclosure, an image sensor is provided comprising the pixel circuit as described above.

According to a third aspect of the embodiments of the present disclosure, an image acquisition apparatus is provided comprising the image sensor as described above.

According to the pixel circuit, the driving method, the image sensor and the image acquisition apparatus of the embodiments of the present disclosure, the compensation circuit can compensate for the voltage drift of the threshold voltage of the output signal generation circuit so that different pixel circuits or the same pixel circuit at different times can generate the same output signal for the same incident light. The pixel circuit, the driving method, the image sensor and the image acquisition apparatus of the embodiments of the present disclosure may mitigate or eliminate the distortion of the acquired image.

BRIEF DESCRIPTION OF THE DRAWINGS

In order to illustrate more clearly the technical solution of the embodiments of the present disclosure, the accompanying drawings of the embodiments will be briefly described below. It should be understood that the drawings described below refer only to some embodiments of the present disclosure and are not to be construed as limiting of the present disclosure. In the drawings.

DETAILED DESCRIPTION

In order to render the technical solution and advantages of the embodiments of the present disclosure more apparent, the technical solution of the embodiments of the present disclosure will be described hereinafter with reference to the accompanying drawings. It is apparent that the described embodiments are part of, rather than all of, embodiments of the present disclosure. All other embodiments derived from the described embodiments of the present disclosure by those skilled in the art without the need for inventive efforts are also within the scope of the present disclosure.

Figure 1:
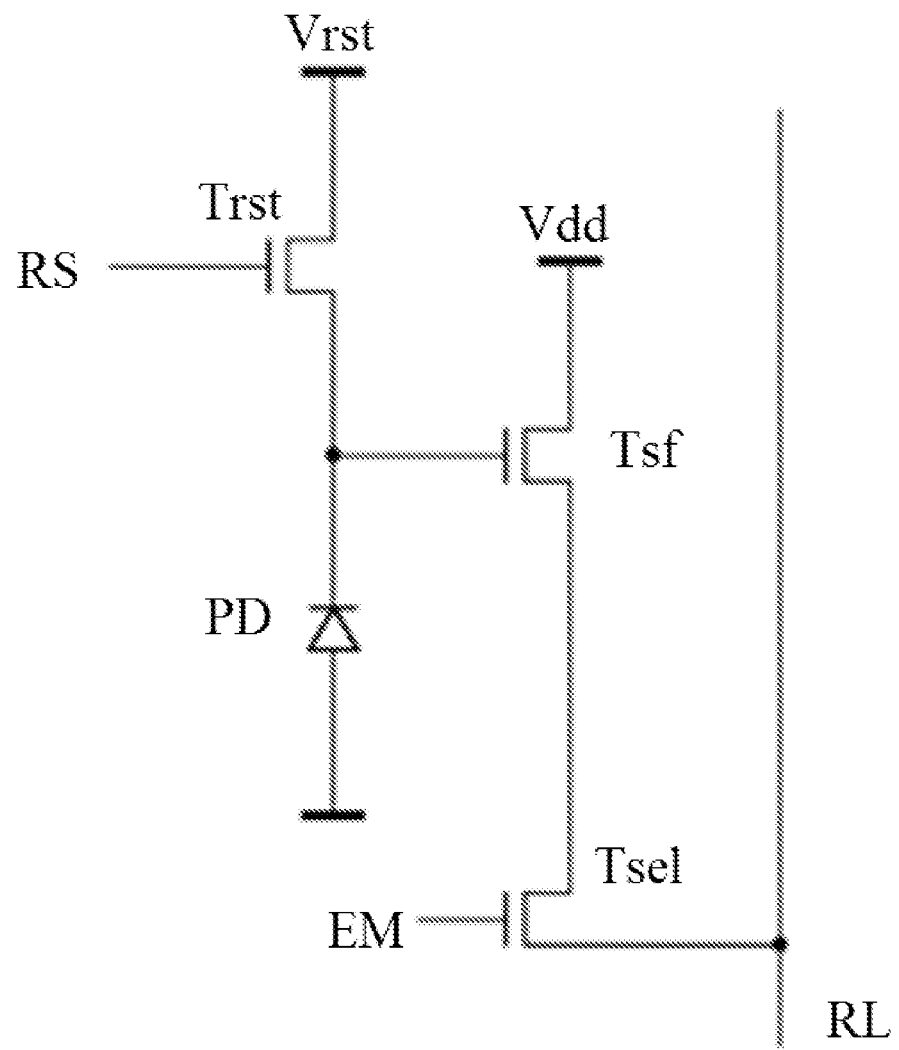
FIG. 1 is a pixel circuit diagram as an example.

FIG. 1 is a pixel circuit diagram as an example. The pixel circuit is known as an active pixel sensor (APS). As shown in FIG. 1, the pixel circuit includes three transistors and a photodiode PD, and thus is also called a 3T APS. The three transistors include a source follower Tsf, a select switching transistor Tsel, and a reset switching transistor Trst. In an initialization phase, the reset switching transistor Trst is turned on by a reset signal to reversely bias the photodiode PD using a reset voltage Vrst, and the reset voltage Vrst charges the PN junction capacitor of the photodiode PD. In a photoelectric conversion phase, when incident light impinges on the PN junction of the photodiode PD, electron-hole pairs are created in the PN junction and charges in the PN junction capacitor recombines, leading to a change in the voltage stored in the PN junction capacitor. In an output phase, the switching transistor Tsel is turned on, the voltage stored in the PN junction capacitor causes a drop in the gate potential of the source follower Tsf, and the source follower Tsf generates an output signal. The output signal is then output to a column output bus and read by a read circuit. An image is finally acquired by the image sensor based on the output signal.

However, in the actual fabrication process, there may have been differences among the source follower devices in the pixel circuit. Hence, different source followers, or the same source follower at different times, may generate different output signals even for the same incident light, thus resulting in image distortion.

Figure 2:
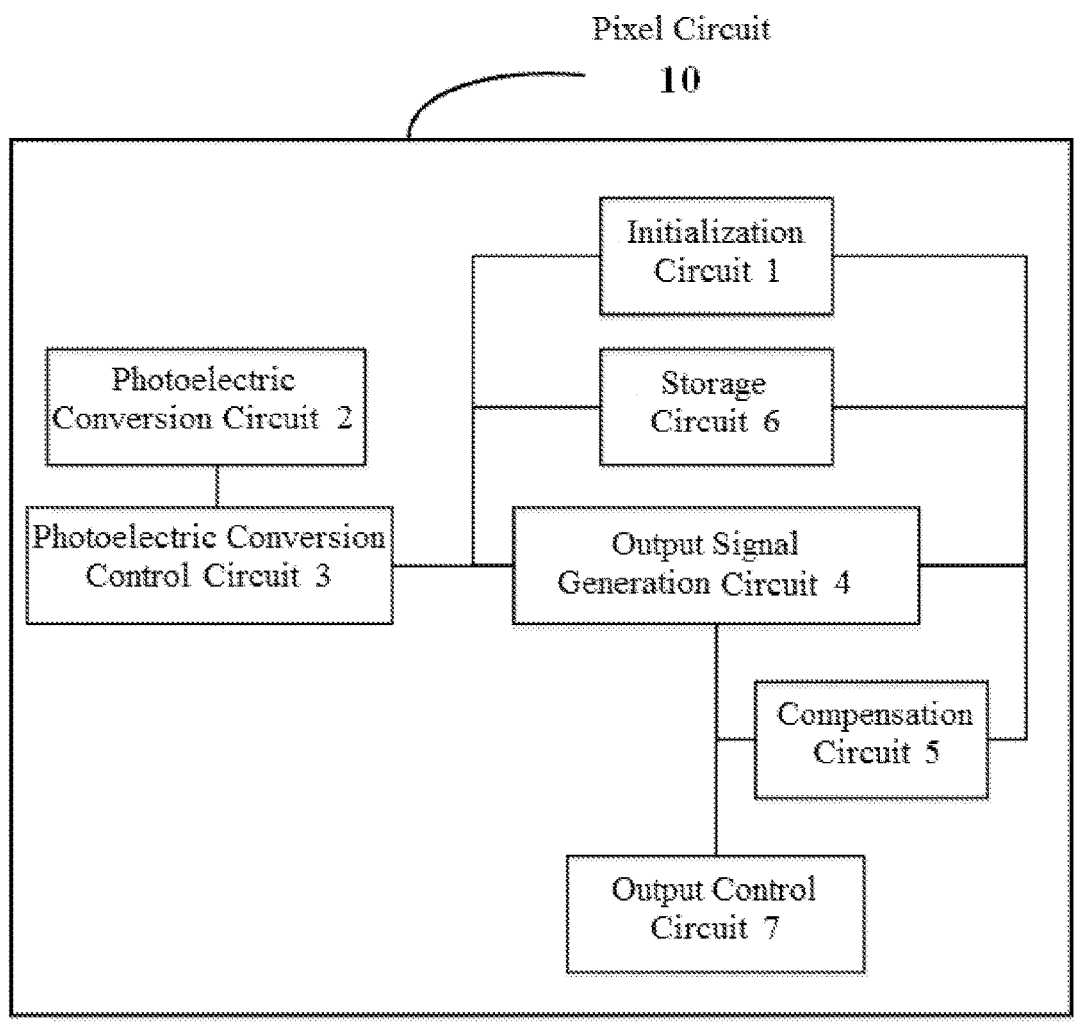
FIG. 2 is a block diagram of a pixel circuit according to a first embodiment of the present disclosure.

FIG. 2 is a block diagram of a pixel circuit according to a first embodiment of the present disclosure. The pixel circuit 10 includes an initialization circuit 1, a photoelectric conversion circuit 2, a photoelectric conversion control circuit 3, an output signal generation circuit 4, a compensation circuit 5, a storage circuit 6, and an output control circuit 7. The initialization circuit 1 is configured to initialize a voltage stored in the storage circuit 6 of the pixel circuit 10. The photoelectric conversion circuit 2 is configured to convert the incident light into an electrical signal. The photoelectric conversion control circuit 3 is connected to the photoelectric conversion circuit 2 and is configured to control the photoelectric conversion circuit 2 to convert the incident light into the electric signal and store it in the storage circuit 6. The output signal generation circuit 4 is connected to the photoelectric conversion control circuit 3 and is configured to generate an output signal of the pixel circuit 10 corresponding to the incident light in dependence on the electric signal converted by the photoelectric conversion circuit 2. The compensation circuit 5 is connected to the output signal generation circuit 4 and is configured to acquire a threshold voltage of the output signal generation circuit 4 and store it in the storage circuit 6. The storage circuit 6 is connected to the photoelectric conversion control circuit 3 and the output signal generation circuit 4 and is configured to store the electrical signal converted by the photoelectric conversion circuit 2 and the threshold voltage of the output signal generation circuit 4. The output control circuit 7 is connected to the output signal generation circuit 4 and is configured to control the output of the output signal of the pixel circuit corresponding to the incident light.

According to the pixel circuit of the embodiment of the present disclosure, the compensation circuit can compensate for the voltage drift of the threshold voltage of the output signal generation circuit so that different pixel circuits, or the same pixel circuit at different times can generate the same output signal for the same incident light. The pixel circuit of the embodiments of the present disclosure may mitigate or eliminate the distortion of the acquired image.

In an embodiment of the present disclosure, the storage circuit 6 includes a first storage circuit and a second storage circuit. The first storage circuit is configured to store the threshold voltage of the output signal generation circuit 4. The second storage circuit is configured to store the electrical signal converted by the photoelectric conversion circuit 2. The initialization circuit 1 includes a first initialization circuit and a second initialization circuit. The first initialization circuit is configured to initialize the first storage circuit. The second initialization circuit is configured to initialize the second storage circuit.

Figure 3:
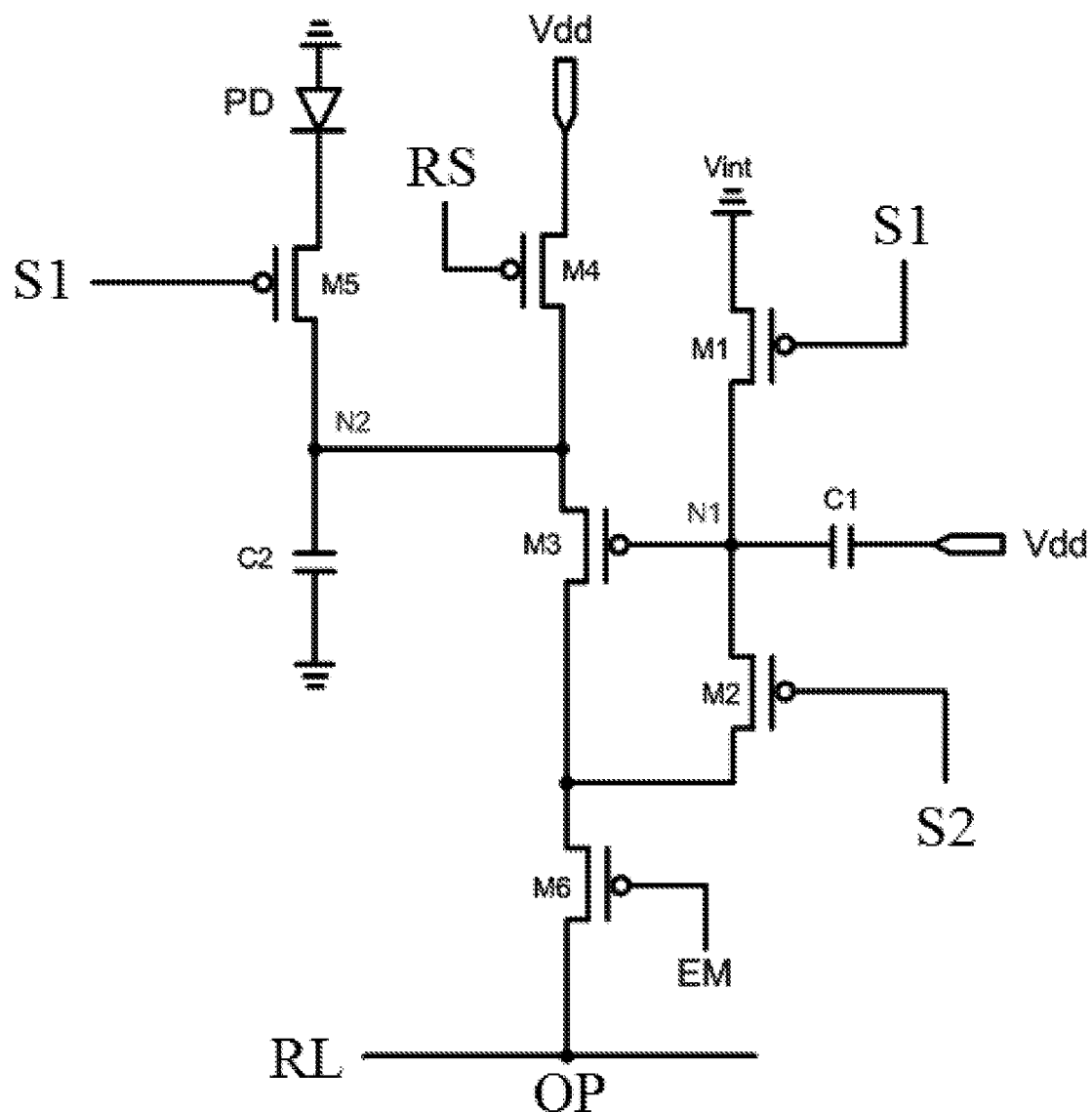
FIG. 3 is a schematic circuit diagram of the pixel circuit shown in FIG. 2.

FIG. 3 is a schematic circuit diagram of the pixel circuit shown in FIG. 2.

The first initialization circuit includes a control terminal, a first terminal and a second terminal. The first initialization circuit includes a first transistor M1. A control terminal of the first transistor M1 is the control terminal of the first initialization circuit, a first terminal of the first transistor M1 is the first terminal of the first initialization circuit, and a second terminal of the first transistor M1 is the second terminal of the first initialization circuit.

The second initialization circuit includes a control terminal, a first terminal and a second terminal. The second initialization circuit includes a fourth transistor M4. A control terminal of the fourth transistor M4 is the control terminal of the second initialization circuit, a first terminal of the fourth transistor M4 is the first terminal of the second initialization circuit, and the second terminal of the fourth transistor M4 is the second of the second initialization circuit terminal.

The photoelectric conversion circuit 2 includes a first terminal and a second terminal. The photoelectric conversion circuit 2 includes a photoelectric conversion device. A first terminal of the photoelectric conversion device is the first terminal of the photoelectric conversion circuit 2, and a second terminal of the photoelectric conversion device is the second terminal of the photoelectric conversion circuit 2. The photoelectric conversion device may be a photodiode PD.

The photoelectric conversion control circuit 3 includes a control terminal, a first terminal and a second terminal. The photoelectric conversion control circuit 3 includes a fifth transistor M5. A control terminal of the fifth transistor M5 is the control terminal of the photoelectric conversion control circuit 3, a first terminal of the fifth transistor M5 is the first terminal of the photoelectric conversion control circuit 3, and a second terminal of the fifth transistor M5 is the second terminal of the photoelectric conversion control circuit 3.

The output signal generation circuit 4 includes a control terminal, a first terminal and a second terminal. The output signal generation circuit 4 includes a third transistor M3. A control terminal of the third transistor M3 is the control terminal of the output signal generation circuit 4, a first terminal of the third transistor M3 is the first terminal of the output signal generation circuit 4, and a second terminal of the third transistor M3 is the second terminal of the output signal generation circuit 4.

The compensation circuit 5 comprises a control terminal, a first terminal and a second terminal. The compensation circuit 5 includes a second transistor M2. A control terminal of the second transistor M2 is the control terminal of the compensation circuit 5, a first terminal of the second transistor M2 is the first terminal of the compensation circuit 5, and a second terminal of the second transistor M2 is the second terminal of the compensation circuit 5.

The first storage circuit includes a first terminal and a second terminal. The first storage circuit includes a first capacitor C1. A first terminal of the first capacitor C1 is the first terminal of the first storage circuit and a second terminal of the first capacitor C1 is the second terminal of the first storage circuit.

The second storage circuit includes a first terminal and a second terminal. The second storage circuit includes a second capacitor C2. A first terminal of the second capacitor C2 is the first terminal of the second storage circuit and a second terminal of the second capacitor C2 is the second terminal of the second storage circuit.

The output control circuit 7 includes a control terminal, a first terminal and a second terminal. The output control circuit 7 includes a sixth transistor M6. A control terminal of the sixth transistor M6 is the control terminal of the output control circuit 7, a first terminal of the sixth transistor M6 is the first terminal of the output control circuit 7, and a second terminal of the sixth transistor M6 is the second terminal of the output control circuit 7.

The control terminal of the first initialization circuit is connected with the first scan signal terminal S1, the first terminal thereof is connected with a first voltage terminal Vint, and the second terminal thereof is connected with the second terminal of the first storage circuit. The control terminal of the second initialization circuit is connected with a third scan signal terminal RS, the first terminal thereof is connected with a second voltage terminal Vdd, and the second terminal thereof is connected with the second terminal of the second storage circuit. The first terminal of the photoelectric conversion circuit 2 is connected to a third voltage terminal GND, and the second terminal thereof is connected to the first terminal of the photoelectric conversion control circuit 3. The control terminal of the photoelectric conversion control circuit 3 is connected to a first scan signal terminal S1 and the second terminal thereof is connected to the second terminal of the second storage circuit. The control terminal of the output signal generation circuit 4 is connected to the second terminal of the first storage circuit, the first terminal thereof is connected to the second terminal of the second storage circuit, and the second terminal thereof is connected to the first terminal of the output control circuit 3. The control terminal of the compensation circuit 5 is connected to a second scan signal terminal S2, the first terminal thereof is connected to the control terminal of the output signal generation circuit 4, and the second terminal thereof is connected to the second terminal of the output signal generation circuit 4. The first terminal of the first storage circuit is connected to the second voltage terminal Vdd. The first terminal of the second storage circuit is connected to the third voltage terminal GND. The control terminal of the output control circuit 7 is connected to a fourth scan signal terminal EM, and the second terminal thereof is connected to a signal output terminal OP.

According to the pixel circuit of the embodiment of the present disclosure, the second transistor of the compensation circuit can compensate for the voltage drift of the threshold voltage of the third transistor of the output signal generation circuit so that different pixel circuits, or the same pixel circuit at different times can generate the same output signal for the same incident light. The pixel circuit of the embodiments of the present disclosure may mitigate or eliminate the distortion of the acquired image.

Figure 4:
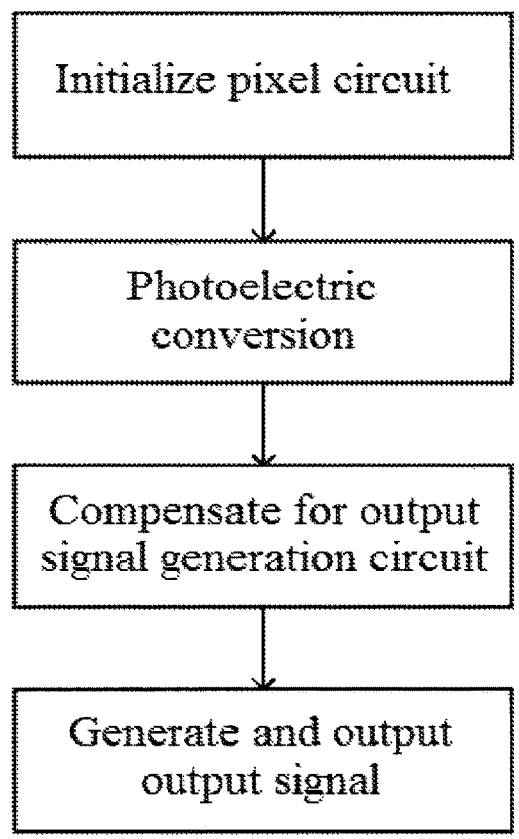
FIG. 4 is a flow chart of a driving method of the pixel circuit shown in FIG. 3.

FIG. 4 is a flowchart of a driving method of the pixel circuit shown in FIG. 3. As shown in FIG. 4, the driving method includes: an initialization phase in which the pixel circuit is initialized by the initialization circuit; a photoelectric conversion phase in which the photoelectric conversion circuit converts, under the control of the photoelectric conversion control circuit, the incident light into an electrical signal and stores it in the storage circuit; a compensation phase in which a threshold voltage of the output signal generation circuit is acquired by the compensation circuit and stored in the storage circuit; and an output phase in which an output signal of the pixel circuit corresponding to the incident light is generated based on the electrical signal stored in the storage circuit by the output signal generation circuit under the control of the output control circuit, and the output signal is output by the pixel circuit.

According to the driving method of the pixel circuit of the embodiment of the present disclosure, the voltage drift of the threshold voltage of the output signal generation circuit can be compensated so that different pixel circuits or the same pixel circuit at different times can produce the same output signal for the same incident light. The driving method of the pixel circuit of the embodiment of the present disclosure may mitigate or eliminate the distortion of the acquired image.

Figure 5:
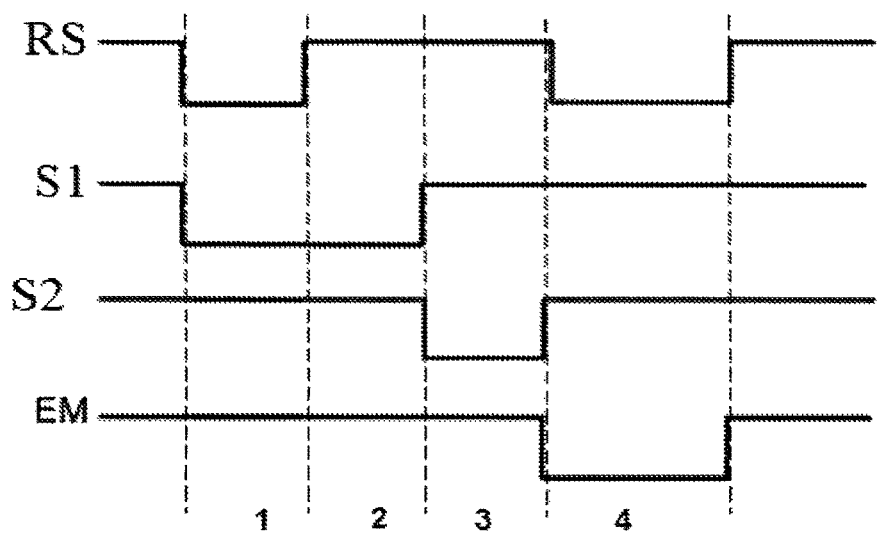
FIG. 5 is a signal timing diagram corresponding to the driving method shown in FIG. 4.

FIG. 5 is a signal timing diagram corresponding to the driving method shown in FIG. 4. As shown in FIG. 5, in the present embodiment, in the initialization phase, the voltage on the first scan signal terminal S1 is at an active level, the voltage on the second scan signal terminal S2 is at an inactive level, the voltage of the third scan signal terminal RS is at an active level, and the voltage of the fourth scan signal terminal EM is at an inactive level. In the photoelectric conversion phase, the voltage of the first scan signal terminal S1 is at an active level, the voltage of the second scan signal terminal S2 is at an inactive level, the voltage of the third scan signal terminal RS is at an inactive level, and the voltage of the fourth scan signal terminal EM is at an inactive level. In the compensation phase, the voltage of the first scan signal terminal S1 is at an inactive level, the voltage of the second scan signal terminal S2 is at an active level, the voltage of the third scan signal terminal RS is at an inactive level, and the voltage of the fourth scan signal terminal EM is at an inactive level. In the output phase, the voltage of the first scan signal terminal S1 is at an inactive level, the voltage of the second scan signal terminal S2 is at an inactive level, the voltage of the third scan signal terminal RS is at an active level, and the voltage of the fourth scan signal terminal EM is at an active level.

It is generally understood in the art that a voltage at an active level is such that an intended circuit is enabled when the voltage is applied to the circuit (e.g., a switching transistor in the circuit is turned on), and that a voltage at an inactive level is such that an intended circuit is disabled when the voltage is applied to the circuit (e.g., a switching transistor in the circuit is turned off).

In the embodiment of the present disclosure, the first transistor M1, the second transistor M2, the fourth transistor M4, the fifth transistor M5, and the sixth transistor M6 are switching transistors, and the third transistor M3 is a driving transistor that operates as a source follower.

Explanation is made using an example where the transistors are of a P-type and accordingly have a low active level and a high inactive level. It should be noted that the high and low levels are only used to distinguish whether the voltage can bring the transistor into conduction, without limiting the value of the voltage. For example, a low level may refer to a ground level or a negative level. In addition, P-type TFT transistors are selected for the purpose of illustration and are not to be construed as specifically limiting the type of transistor. In accordance with the principles of the present disclosure, those skilled in the art will be able to appropriately select and adjust the type of transistor without paying any inventive effort, and these selections and adjustments are also considered to fall within the scope of the present disclosure.

Figure 6:
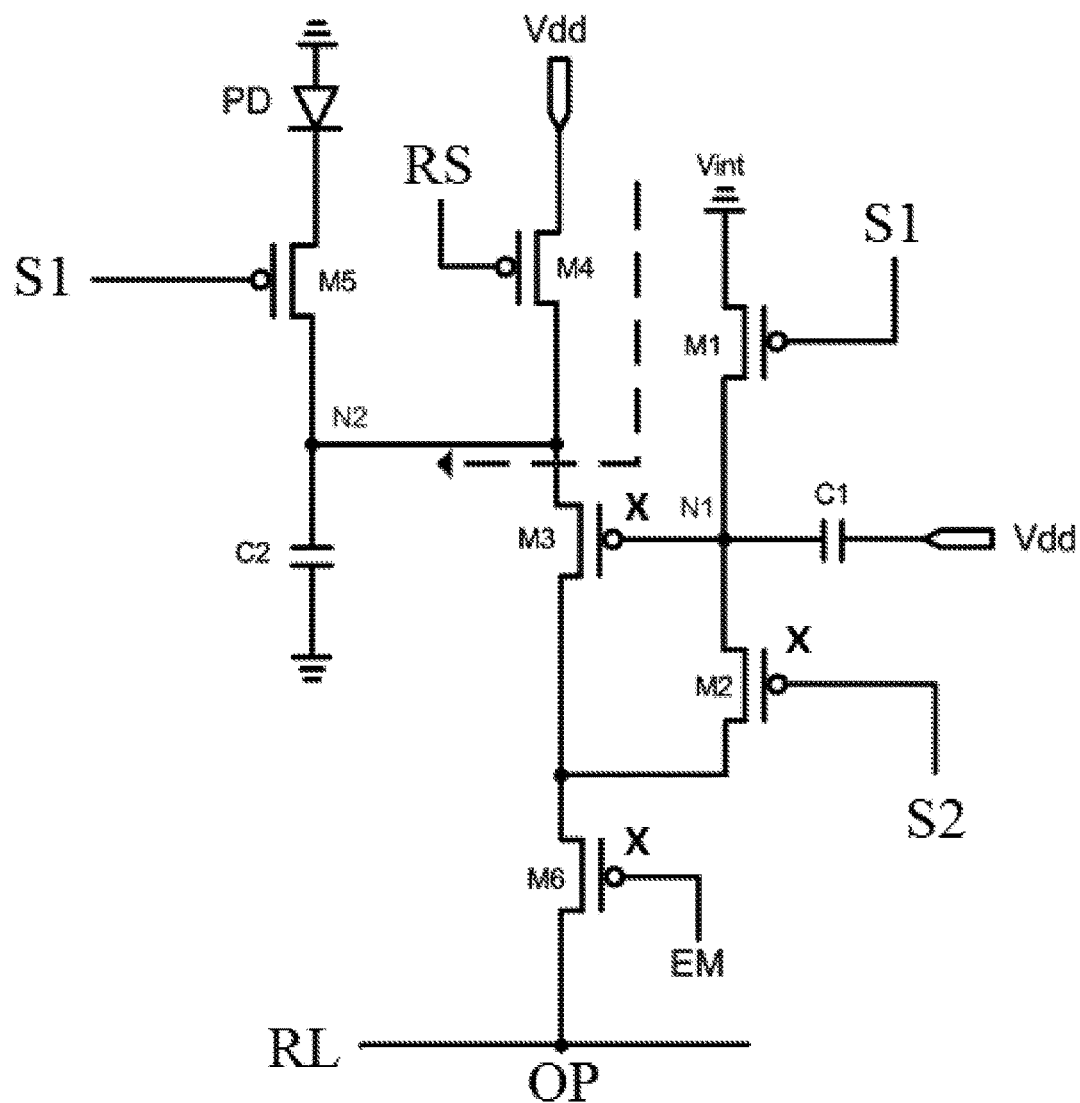
FIG. 6 is a schematic diagram of the state of the pixel circuit shown in FIG. 3 during an initialization phase.
Figure 7:
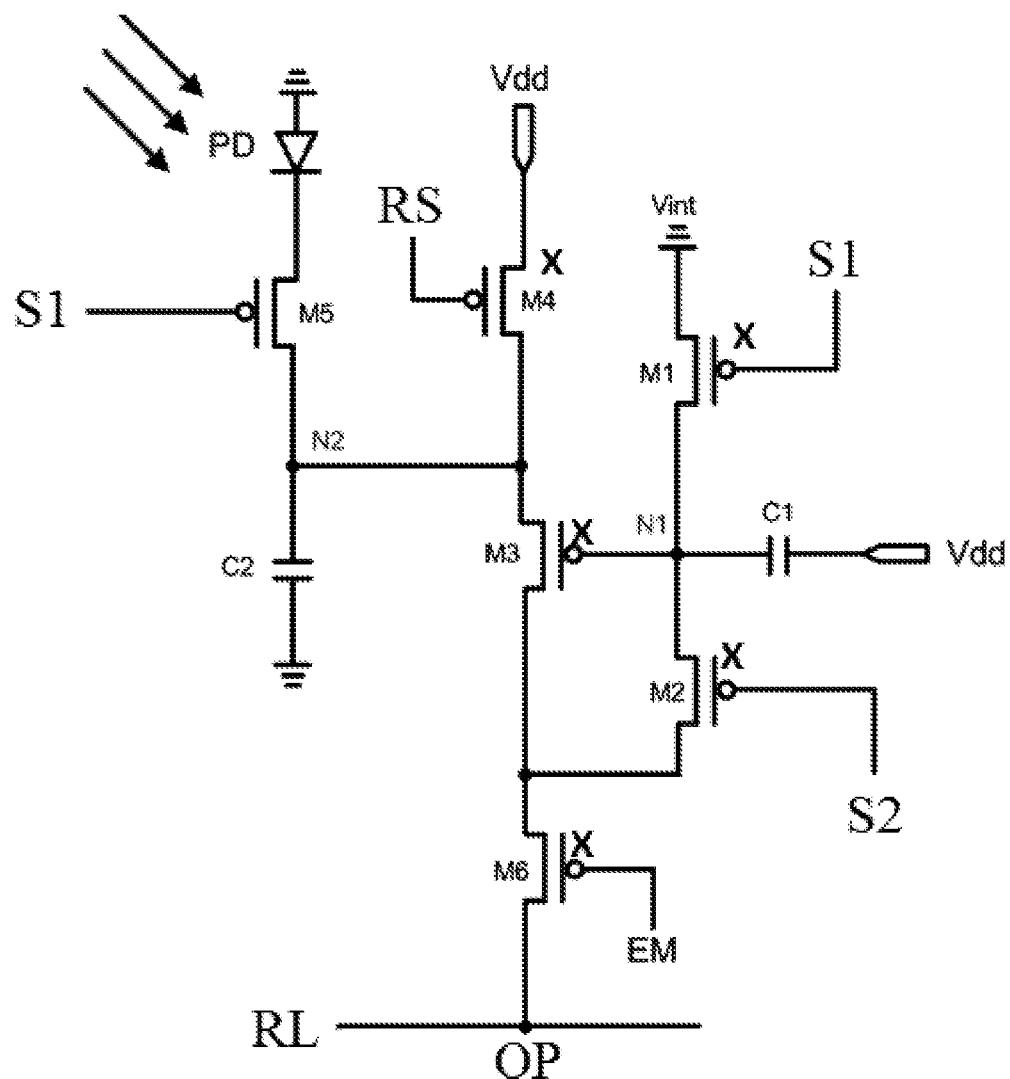
FIG. 7 is a schematic diagram of the state of the pixel circuit shown in FIG. 3 during a photoelectric conversion phase.
Figure 8:
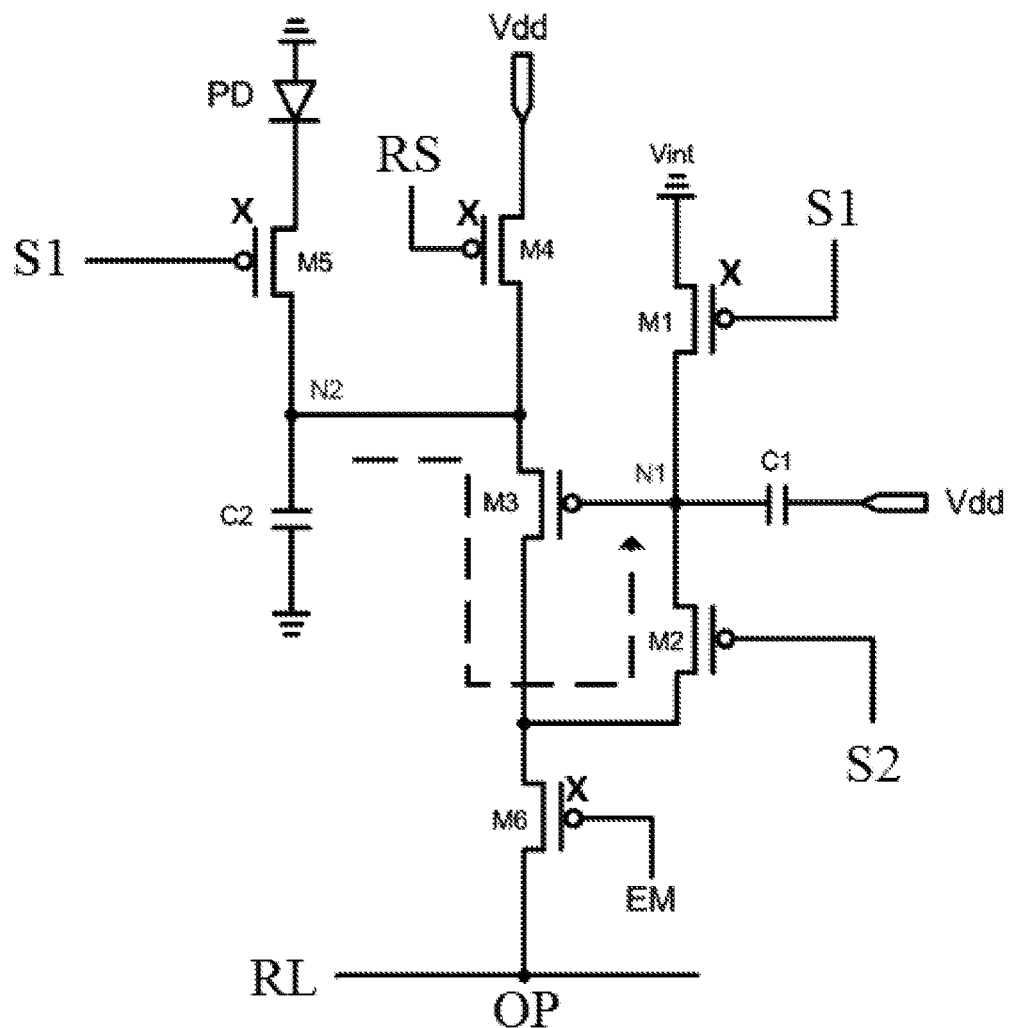
FIG. 8 is a schematic diagram of the state of the pixel circuit shown in FIG. 3 during a compensation phase.
Figure 9:
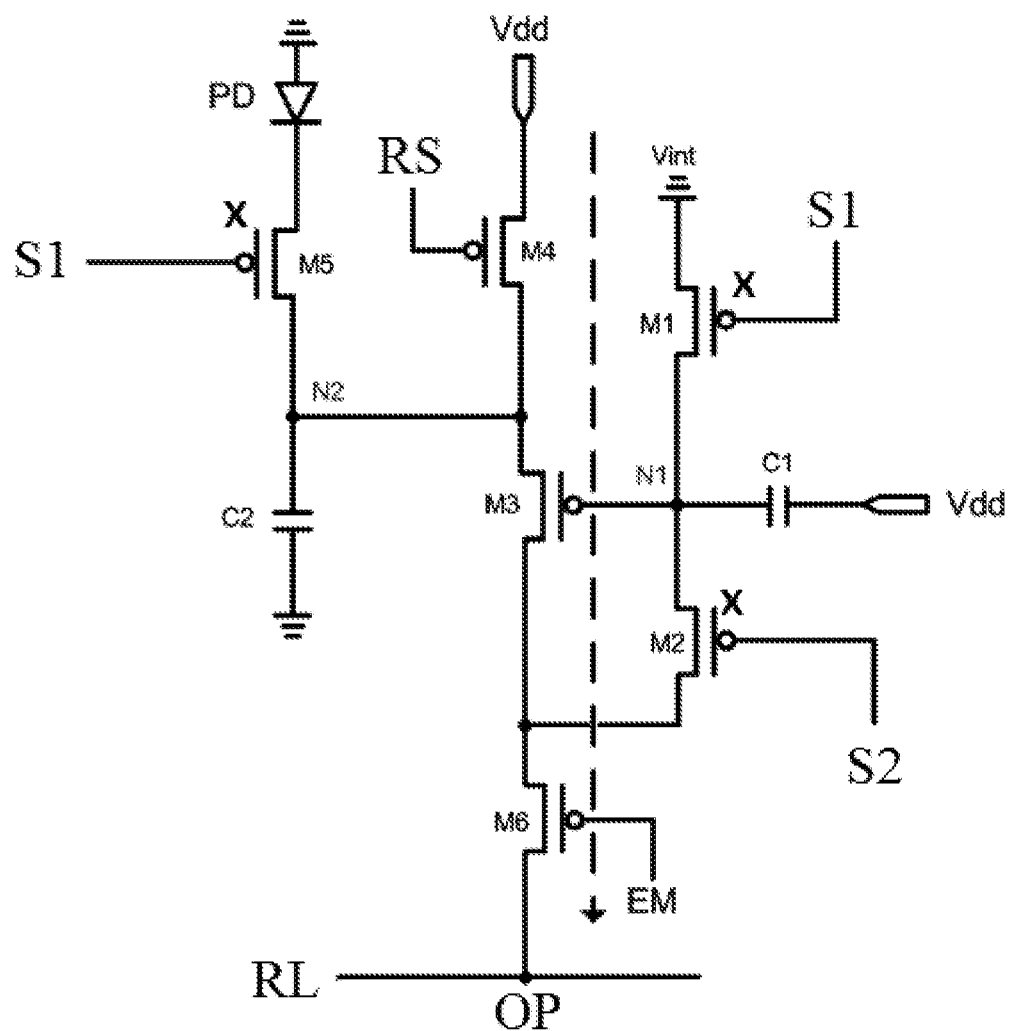
FIG. 9 is a schematic diagram of the state of the pixel circuit shown in FIG. 3 during an output phase.

FIG. 6 is a schematic diagram of the state of the pixel circuit shown in FIG. 3 during the initialization phase. FIG. 7 is a schematic diagram of the state of the pixel circuit shown in FIG. 3 during the photoelectric conversion phase. FIG. 8 is a schematic diagram of the state of the pixel circuit shown in FIG. 3 during the compensation phase. FIG. 9 is a schematic diagram of the state of the pixel circuit shown in FIG. 3 during the output phase. In these figures, "X" indicates that the transistor involved is off and the arrow indicates the direction of the current.

In the embodiment of the present disclosure, the voltage of the first voltage terminal Vint is at a low level, the voltage of the second voltage terminal Vdd is at a high level, and the voltage of the third voltage terminal GND is at a low level. Moreover, the voltage of the first voltage terminal Vint may be equal to the voltage of the third voltage terminal GND. Further, the first voltage terminal Vint may be connected to the third voltage terminal GND, thus further reducing the number of ports required.

As shown in FIG. 6, the first transistor M1, the fourth transistor M4, and the fifth transistor M5 are turned on and the second transistor M2, the third transistor M3, and the sixth transistor M6 are turned off in the initialization phase. A first node N1 to which the second terminal of the first capacitor C1 and the control terminal of the third transistor M3 are connected is connected to the first voltage terminal Vint. The voltage of the first node N1 is initialized to a low level, for example, 0V. A second node N2 to which the second terminal of the second capacitor C2 and the first terminal of the third transistor M3 are connected is connected to the second voltage terminal Vdd. The voltage of the second node N2 is initialized to a high level, i.e., the voltage Vvdd of the second voltage terminal Vdd.

As shown in FIG. 7, in the photoelectric conversion phase, the fifth transistor M5 is turned on, and the first transistor M1, the second transistor M2, the third transistor M3, the fourth transistor M4, and the sixth transistor M6 are turned off. The photoelectric conversion device, for example, the photodiode PD receives the irradiation of the incident light and is excited by the light quantum to generate electron-hole pairs in the PN junction of the photodiode PD, leading to recombination of the charges in the PN junction capacitor and dropping of the voltage of the second node N2 to Vdata, where Vdata is the electrical signal converted by the photodiode PD. The second capacitor C2 stores the voltage Vdata.

As shown in FIG. 8, the second transistor M2 and the third transistor M3 are turned on and the first transistor M1, the fourth transistor M4, the fifth transistor M5 and the sixth transistor M6 are turned off in the compensation phase. Since the voltage of the first node N1 is 0V, the third transistor M3 is turned on and the voltage Vdata starts to charge the first node N1 (i.e., the first capacitor C1) through the fifth transistor M5, the third transistor M3 and the second transistor M2 until the voltage of the first node N1 is charged to Vdata−Vth, i.e., the voltage difference between the first terminal and the control electrode of the third transistor M3 is Vth, where Vth is the threshold voltage at which the third transistor M3 generates the output signal. After completion of the charging, the voltage of the first node N1 (i.e., the voltage at the second terminal of the first capacitor C1) is maintained at Vdata−Vth.

As shown in FIG. 9, the third transistor M3, the fourth transistor M4, and the sixth transistor M6 are turned on and the first transistor M1, the second transistor M2, and the fifth transistor M5 are turned off in the output phase. The first terminal of the third transistor M3 is connected to the second voltage terminal Vdd, and the voltage at the first terminal of the third transistor M3 is Vvdd. The voltage of the control electrode of the third transistor M3 is Vdata−Vth. Therefore, the output signal generated by the third transistor M3 is the current $I=K[Vvdd-(Vdata-Vth)-Vth]^2=K(Vvdd-Vdata)^2$, where K is a constant value related to the structure of the third transistor M3. The current I is output to a signal read line RL via the signal output terminal OP.

The current I is only related to Vdd and Vdata and is independent of the threshold voltage Vth which suffers the voltage drift. Vvdd is a constant value, and Vdata is generated by the photodiode PD and related to the incident light.

According to the driving method of the pixel circuit of the embodiment of the present disclosure, the voltage drift of the threshold voltage of the third transistor of the output signal generation circuit is compensated so that different pixel circuits or the same pixel circuit at different times can produce the same output signal for the same incident light. The driving method of the pixel circuit of the embodiment of the present disclosure may mitigate or eliminate the distortion of the acquired image.

The embodiments of the present disclosure also provide an image sensor including the above-described pixel circuit.

The embodiments of the present disclosure further provide an image acquisition apparatus including the above-described image sensor. The image acquisition apparatus may be any product or component having an image acquisition function such as a camera, a video camera, a mobile phone, a tablet, or the like.

According to the image sensor and the image acquisition apparatus of the embodiment of the present disclosure, the compensation circuit can compensate for the voltage drift of the output signal generation circuit so that different pixel circuits or the same pixel circuit at different times can produce the same output signal for the same incident light. The pixel circuit, the driving method, the image sensor and the image acquisition apparatus of the embodiments of the present disclosure may mitigate or eliminate the distortion of the acquired image.

It is to be understood that the above embodiments are merely exemplary embodiments for the purpose of illustrating the principles of the present disclosure; however, the present disclosure is not limited thereto. Various variations and modifications can be made by those of ordinary skill in the art without departing from the spirit and essence of the present disclosure, which are also regarded as within the scope of the present disclosure.

What is claimed is:

1. A pixel circuit comprising:
  a storage circuit;
  an initialization circuit configured to initialize a voltage stored by the storage circuit;
  a photoelectric conversion circuit configured to convert incident light into an electrical signal;
  a photoelectric conversion control circuit connected to the photoelectric conversion circuit and configured to control the photoelectric conversion circuit to convert the incident light into the electrical signal and store the electrical signal in the storage circuit;
  an output signal generation circuit connected to the photoelectric conversion control circuit and configured to generate an output signal of the pixel circuit corresponding to the incident light in dependence on the electrical signal converted by the photoelectric conversion circuit;
  a compensation circuit connected to the output signal generation circuit and configured to acquire and store a threshold voltage of the output signal generation circuit in the storage circuit; and
  an output control circuit connected to the output signal generation circuit and configured to control output of the output signal of the pixel circuit corresponding to the incident light,
  wherein the storage circuit is connected to the photoelectric conversion control circuit and the output signal generation circuit and is configured to store the electrical signal converted by the photoelectric conversion circuit and the threshold voltage of the output signal generation circuit.

2. The pixel circuit of claim 1, wherein:
  the output signal generation circuit comprises a control terminal, a first terminal and a second terminal;
  the compensation circuit comprises a control terminal, a first terminal and a second terminal; and
  the control terminal of the compensation circuit is connected with a second scan signal terminal, the first terminal of the compensation circuit is connected with the control terminal of the output signal generation circuit, and the second terminal of the compensation circuit is connected with the second terminal of the output signal generation circuit.

3. The pixel circuit of claim 2, wherein the output signal generation circuit comprises a third transistor, a control terminal of the third transistor being the control terminal of the output signal generation circuit, a first terminal of the third transistor being the first terminal of the output signal generation circuit, a second terminal of the third transistor being the second terminal of the output signal generation circuit.

4. The pixel circuit of claim 2, wherein the compensating circuit comprises a second transistor, a control terminal of the second transistor being the control terminal of the compensation circuit, a first terminal of the second transistor being the first terminal of the compensation circuit, a second terminal of the second transistor being the second terminal of the compensation circuit.

5. The pixel circuit of claim 2, wherein:
the storage circuit comprises:
   a first storage circuit configured to store the threshold voltage of the output signal generation circuit; and
   a second storage circuit configured to store the electrical signal converted by the photoelectric conversion circuit; and
the initialization circuit comprises:
   a first initialization circuit configured to initialize the first storage circuit; and
   a second initialization circuit configured to initialize the second storage circuit.

6. The pixel circuit of claim 5, wherein:
the first initialization circuit comprises a control terminal, a first terminal and a second terminal;
the second initialization circuit comprises a control terminal, a first terminal and a second terminal;
the photoelectric conversion circuit comprises a first terminal and a second terminal;
the photoelectric conversion control circuit comprises a control terminal, a first terminal and a second terminal;
the first storage circuit comprises a first terminal and a second terminal;
the second storage circuit comprises a first terminal and a second terminal;
the output control circuit comprises a control terminal, a first terminal and a second terminal;
the control terminal of the first initialization circuit is connected with a first scan signal terminal, the first terminal of the first initialization circuit is connected with a first voltage terminal, and the second terminal of the first initialization circuit is connected with the second terminal of the first storage circuit;
the control terminal of the second initialization circuit is connected with a third scan signal terminal, the first terminal of the second initialization circuit is connected with a second voltage terminal, and the second terminal of the second initialization circuit is connected with the second terminal of the second storage circuit;
the first terminal of the photoelectric conversion circuit is connected with a third voltage terminal, and the second terminal of the photoelectric conversion circuit is connected with the first terminal of the photoelectric conversion control circuit;
the control terminal of the photoelectric conversion control circuit is connected with the first scan signal terminal, and the second terminal of the photoelectric conversion control circuit is connected with the second terminal of the second storage circuit;
the control terminal of the output signal generation circuit is connected with the second terminal of the first storage circuit, the first terminal of the output signal generation circuit is connected with the second terminal of the second storage circuit, and the second terminal of the output signal generation circuit is connected with the first terminal of the output control circuit;
the first terminal of the first storage circuit is connected with the second voltage terminal;
the first terminal of the second storage circuit is connected with the third voltage terminal; and
the control terminal of the output control circuit is connected with a fourth scan signal terminal, and the second terminal of the output control circuit is connected with a signal output terminal.

7. The pixel circuit of claim 6, wherein the first initialization circuit comprises a first transistor, a control terminal of the first transistor being the control terminal of the first initialization circuit, a first terminal of the first transistor being the first terminal of the first initialization circuit, a second terminal of the first transistor being the second terminal of the first initialization circuit.

8. The pixel circuit of claim 6, wherein the second initialization circuit comprises a fourth transistor, a control terminal of the fourth transistor being the control terminal of the second initialization circuit, a first terminal of the fourth transistor being the first terminal of the second initialization circuit, a second terminal of the fourth transistor being the second terminal of the second initialization circuit.

9. The pixel circuit of claim 6, wherein the photoelectric conversion circuit comprises a photoelectric conversion device, a first terminal of the photoelectric conversion device being the first terminal of the photoelectric conversion circuit, a second terminal of the photoelectric conversion device being the second terminal of the photoelectric conversion circuit.

10. The pixel circuit of claim 9, wherein the photoelectric conversion device is a photodiode.

11. The pixel circuit of claim 6, wherein the photoelectric conversion control circuit comprises a fifth transistor, a control terminal of the fifth transistor being the control terminal of the photoelectric conversion control circuit, a first terminal of the fifth transistor being the first terminal of the photoelectric conversion control circuit, a second terminal of the fifth transistor being the second terminal of the photoelectric conversion control circuit.

12. The pixel circuit of claim 6, wherein the first storage circuit comprises a first capacitor, a first terminal of the first capacitor being the first terminal of the first storage circuit, a second terminal of the first capacitor being the first terminal of the first storage circuit.

13. The pixel circuit of claim 6, wherein the second storage circuit comprises a second capacitor, a first terminal of the second capacitor being the first terminal of the second storage circuit, a second terminal of the second capacitor being the second terminal of the second storage circuit.

14. The pixel circuit of claim 6, wherein the output control circuit comprises a sixth transistor, a control terminal of the sixth transistor being the control terminal of the output control circuit, a first terminal of the sixth transistor being the first terminal of the output control circuit, a second terminal of the sixth transistor being the second terminal of the output control circuit.

15. A pixel circuit driving method for driving the pixel circuit of claim 1, comprising:

in an initialization phase, initializing by the initialization circuit a voltage stored in the storage circuit;

in a photoelectric conversion phase, converting incident light into an electrical signal and storing the electrical signal in the storage circuit, by the photoelectric conversion circuit under control of the photoelectric conversion control circuit;

in a compensation phase, acquiring and storing by the compensation circuit a threshold voltage of the output signal generation circuit in the storage circuit; and in an output phase, generating an output signal of the pixel circuit corresponding to the incident light based on the electrical signal stored in the storage circuit by the output signal generation circuit under control of the output control circuit, and outputting the output signal by the pixel circuit.

16. The pixel circuit driving method of claim 15, wherein:
the storage circuit comprises:
    a first storage circuit configured to store the threshold voltage of the output signal generation circuit; and
    a second storage circuit configured to store the electrical signal converted by the photoelectric conversion circuit;
the initialization circuit comprises:
    a first initialization circuit configured to initialize the first storage circuit; and
    a second initialization circuit configured to initialize the second storage circuit;
the first initialization circuit comprises a control terminal, a first terminal and a second terminal;
the second initialization circuit comprises a control terminal, a first terminal and a second terminal;
the photoelectric conversion circuit comprises a first terminal and a second terminal;
the photoelectric conversion control circuit comprises a control terminal, a first terminal and a second terminal;
the output signal generation circuit comprises a control terminal, a first terminal and a second terminal;
the compensation circuit comprises a control terminal, a first terminal and a second terminal;
the first storage circuit comprises a first terminal and a second terminal;
the second storage circuit comprises a first terminal and a second terminal;
the output control circuit comprises a control terminal, a first terminal and a second terminal;
the control terminal of the first initialization circuit is connected with a first scan signal terminal, the first terminal of the first initialization circuit is connected with a first voltage terminal, and the second terminal of the first initialization circuit is connected with the second terminal of the first storage circuit;
the control terminal of the second initialization circuit is connected with a third scan signal terminal, the first terminal of the second initialization circuit is connected with a second voltage terminal, and the second terminal of the second initialization circuit is connected with the second terminal of the second storage circuit;
the first terminal of the photoelectric conversion circuit is connected with a third voltage terminal, and the second terminal of the photoelectric conversion circuit is connected with the first terminal of the photoelectric conversion control circuit;
the control terminal of the photoelectric conversion control circuit is connected with the first scan signal terminal, and the second terminal of the photoelectric conversion control circuit is connected with the second terminal of the second storage circuit;

the control terminal of the output signal generation circuit is connected with the second terminal of the first storage circuit, the first terminal of the output signal generation circuit is connected with the second terminal of the second storage circuit, and the second terminal of the output signal generation circuit is connected with the first terminal of the output control circuit;

the control terminal of the compensation circuit is connected with a second scan signal terminal, the first terminal of the compensation circuit is connected with the control terminal of the output signal generation circuit, and the second terminal of the compensation circuit is connected with the second terminal of the output signal generation circuit;

the first terminal of the first storage circuit is connected with the second voltage terminal;

the first terminal of the second storage circuit is connected with the third voltage terminal;

the control terminal of the output control circuit is connected with a fourth scan signal terminal, and the second terminal of the output control circuit is connected with a signal output terminal;

the voltage at the first voltage terminal is at a low level, the voltage at the second voltage terminal is at a high level, and the voltage at the third voltage terminal is at a low level;

in the initialization phase, the voltage at the first scan signal terminal is at an active level, the voltage at the second scan signal terminal is at an inactive level, the voltage at the third scan signal terminal is at an active level, and the voltage at the fourth scan signal terminal is at an inactive level;

in the photoelectric conversion phase, the voltage at the first scan signal terminal is at an active level, the voltage at the second scan signal terminal is at an inactive level, the voltage at the third scan signal terminal is at an inactive level, and the voltage at the fourth scan signal terminal is at an inactive level;

in the compensation phase, the voltage at the first scan signal terminal is at an inactive level, the voltage at the second scan signal terminal is at an active level, the voltage at the third scan signal terminal is at an inactive level, and the voltage at the fourth scan signal terminal is at an inactive level; and in the output phase, the voltage at the first scan signal terminal is at an inactive level, the voltage at the second scan signal terminal is at an inactive level, the voltage at the third scan signal terminal is at an active level, and the voltage at the fourth scan signal terminal is at an active level.

17. The pixel circuit driving method of claim 16, wherein:
in the photoelectric conversion phase, the voltage at the second terminal of the second storage circuit is Vdata, Vdata being the electrical signal converted by the photoelectric conversion circuit;

in the compensation phase, the voltage at the second terminal of the first storage circuit is Vdata−Vth, Vth being the threshold voltage at which the output signal generation circuit generates the output signal; and in the output phase, the output signal generated by the output signal generation circuit is $I=K[Vvdd-(Vdata-Vth)-Vth]^2=K(Vvdd-Vdata)^2$, K being a constant dependent on a structure of the output signal generation circuit, Vvdd being the voltage at the second voltage terminal.

18. An image sensor comprising the pixel circuit as claimed in claim 1.

19. An image acquisition apparatus comprising the image sensor as claimed in claim 18.

* * * * *